(12) United States Patent
Zheng et al.

(10) Patent No.: US 9,240,431 B1
(45) Date of Patent: Jan. 19, 2016

(54) CONDUCTIVE TRENCH ISOLATION

(71) Applicant: OMNIVISION TECHNOLOGIES, INC., Santa Clara, CA (US)

(72) Inventors: Yuanwei Zheng, San Jose, CA (US); Gang Chen, San Jose, CA (US); Duli Mao, Sunnyvale, CA (US); Dyson H. Tai, San Jose, CA (US); Chih-Wei Hsiung, San Jose, CA (US); Arvind Kumar, Fremont, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 14/790,330

(22) Filed: Jul. 2, 2015

Related U.S. Application Data

(62) Division of application No. 14/465,054, filed on Aug. 21, 2014, now Pat. No. 9,111,993.

(51) Int. Cl.
*H01L 21/00* (2006.01)
*H01L 27/146* (2006.01)

(52) U.S. Cl.
CPC ...... *H01L 27/14687* (2013.01); *H01L 27/1462* (2013.01); *H01L 27/1463* (2013.01); *H01L 27/14627* (2013.01); *H01L 27/14643* (2013.01); *H01L 27/14685* (2013.01); *H01L 27/14689* (2013.01)

(58) Field of Classification Search
CPC .................................................. H01L 27/14687

USPC .......................................................... 438/69
See application file for complete search history.

(56) References Cited

U.S. PATENT DOCUMENTS 7,939,359 B2    5/2011    Ohgishi

OTHER PUBLICATIONS

Kitamura, Y. et al., "Suppression of Crosstalk by Using Backside Deep Trench Isolation for 1.12 μm Backside Illuminated CMOS Image Sensor," Image Sensor Technology Development Dept., Semiconductor & Storage Products Company, Toshiba Corporation, Oita, Japan, 2012 IEEE (4 pages).

*Primary Examiner* — Anthony Ho
(74) *Attorney, Agent, or Firm* — Blakely Sokoloff Taylor & Zafman LLP

(57) ABSTRACT

An image sensor including a plurality of photodiodes disposed in a semiconductor layer and a plurality of deep trench isolation regions disposed in the semiconductor layer. The plurality of deep trench isolation regions include: (1) an oxide layer disposed on an inner surface of the plurality of deep trench isolation regions and (2) a conductive fill disposed in the plurality of deep trench isolation regions where the oxide layer is disposed between the semiconductor layer and the conductive fill. A plurality of pinning wells is also disposed in the semiconductor layer, and the plurality of pinning wells in combination with the plurality of deep trench isolation regions separate individual photodiodes in the plurality of photodiodes. A fixed charge layer is disposed on the semiconductor layer, and the plurality of deep trench isolation regions are disposed between the plurality of pinning wells and the fixed charge layer.

10 Claims, 6 Drawing Sheets

FIG. 4A ETCH DEEP TRENCH ISOLATION REGIONS
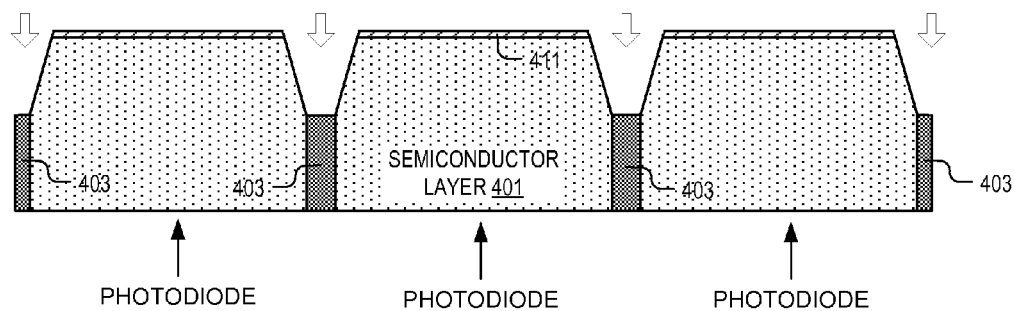
FIG. 4B FORM OXIDE LAYER
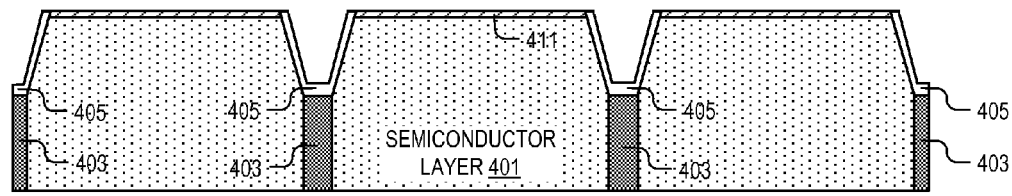
FIG. 4C DEPOSIT CONDUCTIVE FILLING
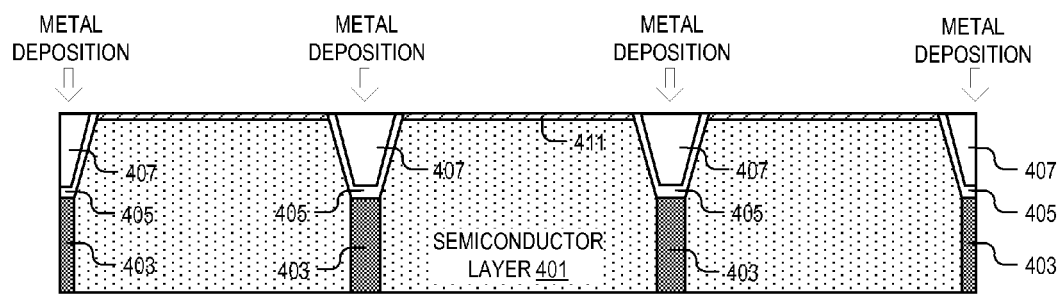

CONDUCTIVE TRENCH ISOLATION

CROSS-REFERENCE TO RELATED APPLICATIONS

This application is a divisional of U.S. patent application Ser. No. 14/465,054, filed on Aug. 21, 2014, now pending. U.S. patent application Ser. No. 14/465,054 is hereby incorporated by reference.

TECHNICAL FIELD

This disclosure relates generally to image sensors, and in particular but not exclusively, relates to electrical isolation in image sensors.

BACKGROUND INFORMATION

Image sensors have become ubiquitous. They are widely used in digital still cameras, cellular phones, security cameras, as well as, medical, automobile, and other applications. The technology used to manufacture image sensors, has continued to advance at a great pace. For example, the demands of higher resolution and lower power consumption have encouraged the further miniaturization and integration of these image sensors.

Pixel crosstalk is a limiting factor in the performance of semiconductor based devices. Ideally each pixel in an image sensor operates as an independent photon detector. In other words, electron/hole content in one pixel does not affect neighboring pixels (or any other pixels in the device). In real image sensors, this is not the case. Electrical signals couple to each other, and charge may spill from one pixel to another. This crosstalk may degrade image resolution, reduce image sensor sensitivity, and cause color-signal mixing. Additionally, defects at semiconductor interface(s) may result in dark current. Unfortunately, many solutions to crosstalk often exaggerate the effects of dark current or contribute to it. Ultimately this combination of dark current and crosstalk may lead to appreciable image degradation.

Accordingly, to mitigate the effects of crosstalk/dark current and enhance image sensor performance, many techniques have been employed. Some of these include using heavily doped regions to isolate individual pixels and employing post-acquisition algorithms to reduce image noise. However, both of these methods still cannot entirely eliminate the effects of pixel crosstalk and dark current.

BRIEF DESCRIPTION OF THE DRAWINGS

Non-limiting and non-exhaustive examples of the invention are described with reference to the following figures, wherein like reference numerals refer to like parts throughout the various views unless otherwise specified.

FIGS. 4A-4E show an example of a process for forming an image sensor, in accordance with the teachings of the present invention.

DETAILED DESCRIPTION

Examples of an apparatus and method for an image sensor with conductive trench isolation are described herein. In the following description, numerous specific details are set forth to provide a thorough understanding of the examples. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Throughout this specification, several terms of art are used. These terms are to take on their ordinary meaning in the art from which they come, unless specifically defined herein or the context of their use would clearly suggest otherwise. It should be noted that element names and symbols are used interchangeably through this document (e.g. Si vs. silicon); however, both have identical meaning.

Figure 1A:
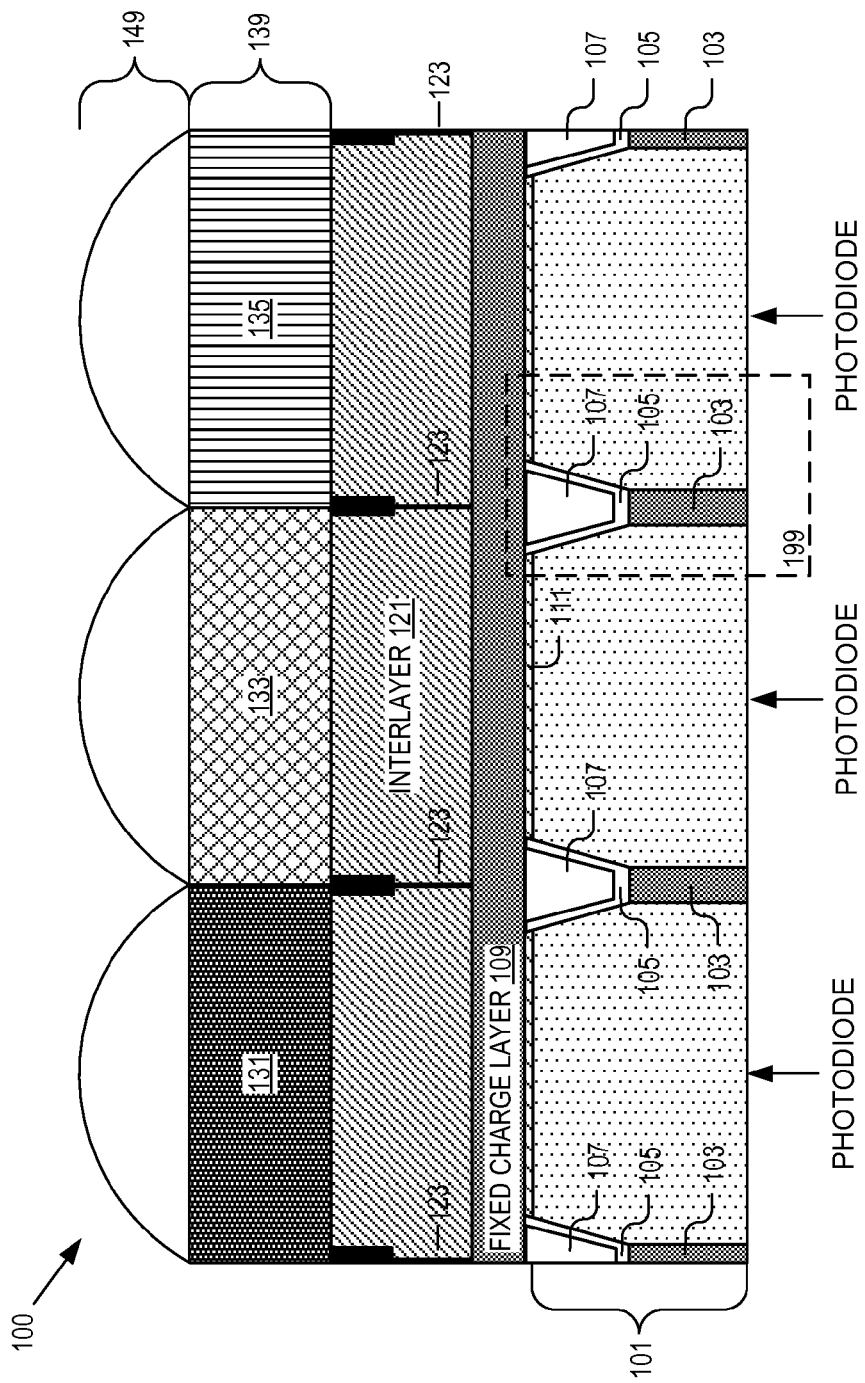
FIG. 1A is a cross sectional view of one example of an image sensor with conductive deep trench isolation regions, in accordance with the teachings of the present invention.

FIG. 1A is a cross sectional view of one example of an image sensor 100 with conductive deep trench isolation regions, in accordance with the teachings of the present invention. Image sensor 100 includes a plurality of photodiodes disposed in a semiconductor layer 101, a plurality of deep trench isolation regions disposed in semiconductor layer 101, a plurality of pinning wells 103 disposed in semiconductor layer 101, and a fixed charge layer 109 disposed on semiconductor layer 101. In one example, semiconductor layer 101 includes silicon. However, in a different example, semiconductor layer 101 may include other semiconductor materials such as germanium, or dopant materials such as arsenic, phosphorus, boron, or the like.

The plurality of deep trench isolation regions include an oxide layer 105 that is disposed on an inner surface of the plurality of deep trench isolation regions, and a conductive fill 107 that is disposed in the plurality of the deep trench isolation regions. In one example, oxide layer 105 includes silicon oxide, and conductive fill 107 includes metal. It should be noted that oxide layer 105 is disposed between semiconductor layer 101 and conductive fill 107. The plurality of deep trench isolation regions in combination with the plurality of pinning wells 103, separate individual photodiodes in the plurality of photodiodes from one another. In one example, the plurality of deep trench isolation regions may contact the plurality of pinning wells 103, and the plurality of deep trench isolation regions in combination with the plurality of pinning wells 103 may extend through semiconductor layer 101.

Fixed charge layer 109 is disposed on semiconductor layer 101, and the plurality of deep trench isolation regions are disposed between the plurality of pinning wells 103 and fixed charge layer 109. In one example, fixed charge layer 109 includes one or more sub-layers. In one example, the one or more sub layers may include metal oxide, metal nitride, metal oxynitride, semiconductor oxide, semiconductor nitride, or semiconductor oxynitride.

In one example, image sensor 100 also includes an interlayer 121 disposed proximate to fixed charge layer 109 such that fixed charge layer 109 is disposed between interlayer 121 and semiconductor layer 101. A light isolation barrier 123 may also be disposed in interlayer 121. Light isolation barrier 123 may be constructed of a metal grid that prevents optical crosstalk between neighboring photodiodes. Light isolation barrier 123 may also extend through interlayer 121.

In the depicted example, light filter layer 139 is formed on interlayer 121. In one example, light filter layer 139 includes red 131, green 133, and blue 135 light filters, which may be arranged into a Bayer pattern, EXR pattern, X-trans pattern, or the like. However, in a different or the same example, light filter layer 139 may include infrared filters, ultraviolet filters, or other light filters that isolate invisible portions of the EM spectrum. Microlens layer 149 is formed proximate to light filter layer 139, such that light filter layer 139 is disposed between fixed charge layer 109 and microlens layer 149.

Figure 1B:
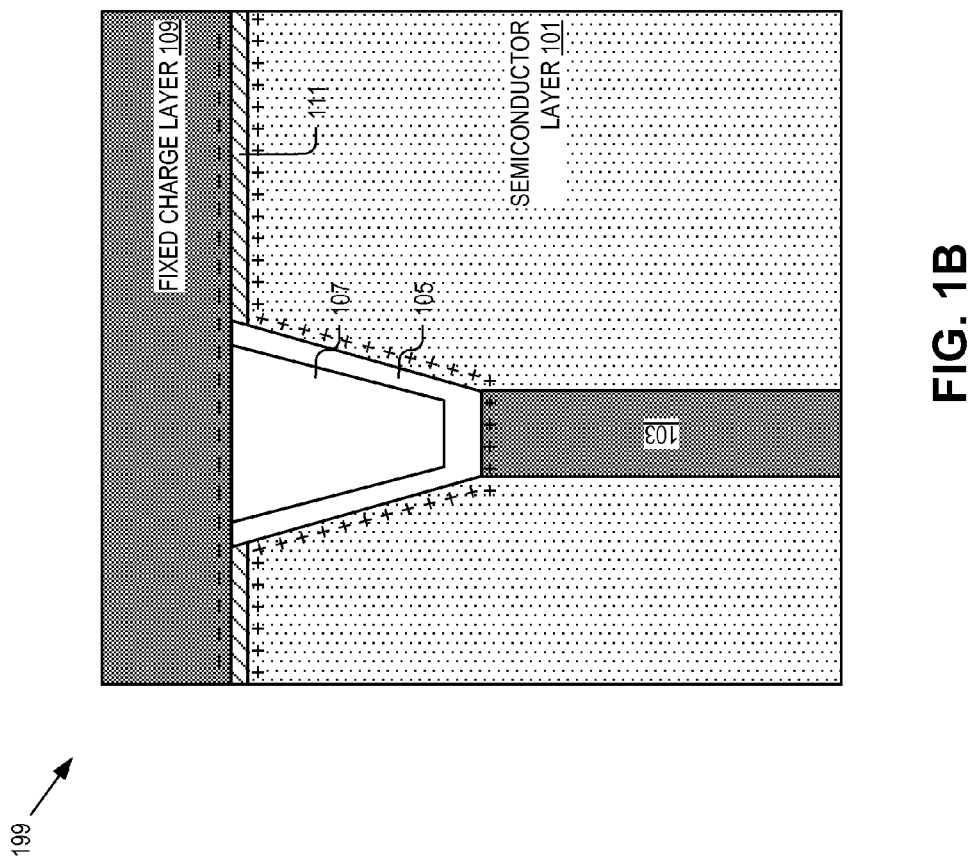
FIG. 1B is a magnified view of the structure within the dashed line of FIG. 1A, in accordance with the teachings of the present invention.

FIG. 1B is a magnified view of the structure 199 within the dashed line of FIG. 1A, in accordance with the teachings of the present invention. FIG. 1B depicts fixed charge layer 109, a deep trench isolation region including oxide layer 105 and conductive fill 107 disposed in semiconductor layer 101, and a pinning well 103 disposed in semiconductor layer 101. As depicted, conductive fill 107 is electrically coupled to fixed charge layer 109, and the combination of conductive fill 107 and fixed charge layer 109 induce an opposite charge as fixed charge layer 109 in semiconductor layer 101 at an interface between semiconductor layer 101 and the combination of the deep trench isolation region and fixed charge layer 109. In other words, charge is induced in semiconductor layer 101 proximate to both the interface between semiconductor layer 101, and fixed charge layer 109, and the interface between semiconductor layer 101 and the plurality of deep trench isolation regions. In the example depicted, fixed charge layer 109 is negatively charged and therefore positive charge is induced in semiconductor layer 101. However, in a different example, a positively charged material may be used to form fixed charge layer 109, in which case negative charge is induced in semiconductor layer 101. It should be noted that a wide variety of binary and ternary material systems may be employed to form fixed charge layer 109. In one example, one or more sub-layers may be used to form fixed charge layer 109. Sub-layers may include metal oxide, metal nitride, metal oxynitride, semiconductor oxide, semiconductor nitride, or semiconductor oxynitride.

It should be noted, that a silicon oxide layer 111 may be formed on semiconductor layer 101. Silicon oxide layer 111 may be kept as one of the sub-layers included in fixed charge layer 109, or may be removed for processing of other charged materials.

By filling the plurality of deep trench isolation regions with conductive fill 107 negative charge from fixed charge layer 109 is effectively coupled to the inner surface of the plurality of deep trench isolation regions (assuming a negatively charged oxide, such as for example hafnium oxide ($HfO_x$), is used to form fixed charge layer 109). This results in positive charge being induced in semiconductor layer 101 both at the interface of semiconductor layer 101 and fixed charge layer 109, and at the interface of semiconductor layer 101 and the plurality of deep trench isolation regions. The positive charge accumulated may help to reduce electrical crosstalk between individual photodiodes/pixels as the positive charging effectively blocks charge transport between Si surface states in semiconductor layer 101. Thus, charge from Si surface states cannot move from pixel to pixel along the backside of image sensor 100 and generate undesirable electrical effects such as crosstalk, dark current, and white pixels. This isolation technique conveys significant advantages over other methods of photodiode/pixel isolation, as the amount of charge unintentionally transferred between photodiodes/pixels is significantly mitigated.

Figure 2:
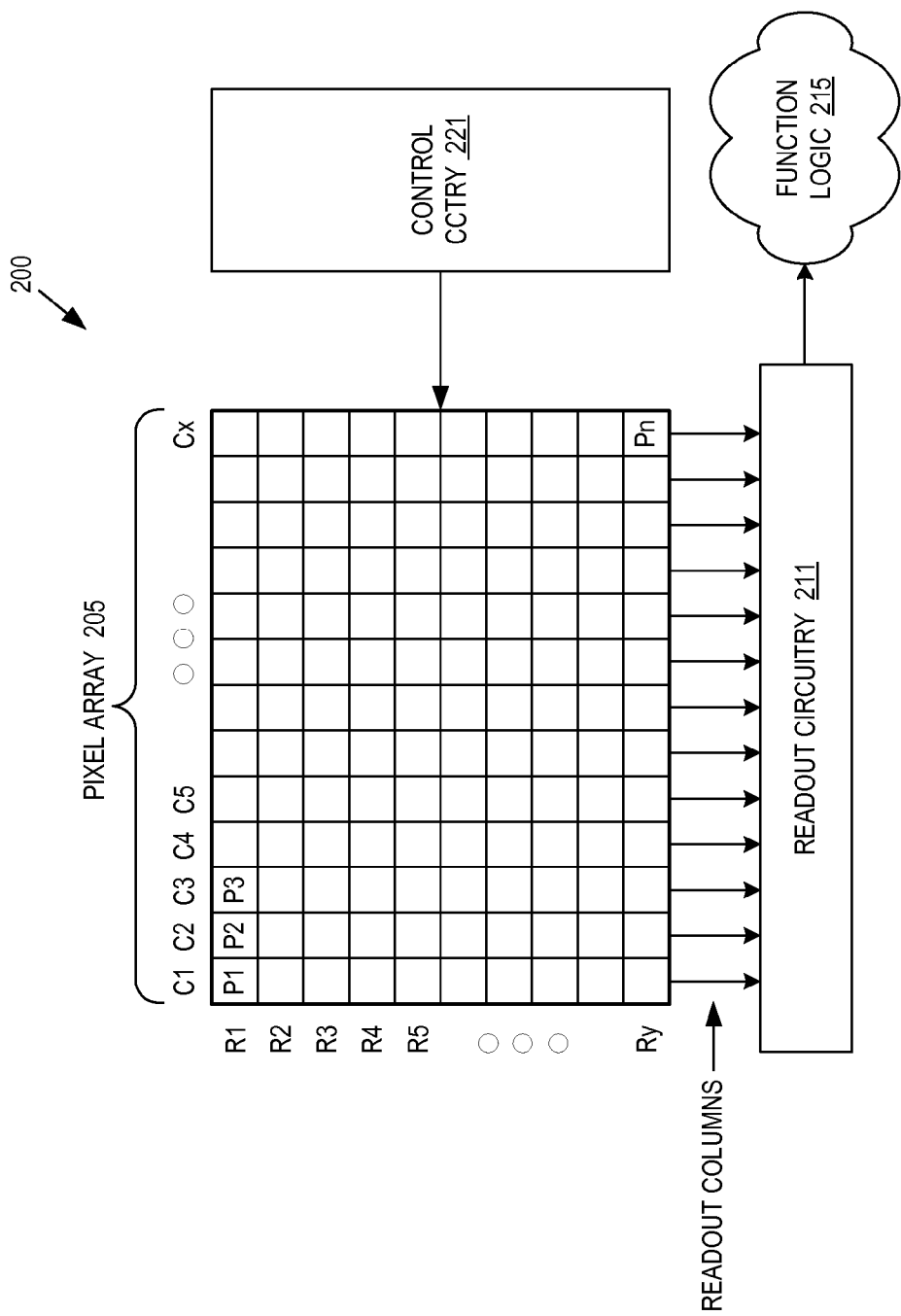
FIG. 2 is a block diagram illustrating one example of an imaging system, in accordance with the teachings of the present invention.

FIG. 2 is a block diagram illustrating one example of an imaging system 200, in accordance with the teachings of the present invention. Imaging system 200 includes pixel array 205, control circuitry 221, readout circuitry 211, and function logic 215. In one example, image sensor 100 is included in an imaging system 200. In one example, pixel array 205 is a two-dimensional (2D) array of photodiodes, or image sensor pixels (e.g. pixels P1, P2 . . . , Pn). As illustrated, photodiodes are arranged into rows (e.g. rows R1 to Ry) and columns (e.g. column C1 to Cx) to acquire image data of a person, place, object, etc., which can then be used to render a 2D image of the person, place, object, etc.

In one example, after each image sensor photodiode/pixel in pixel array 205 has acquired its image data or image charge, the image data is readout by readout circuitry 211 and then transferred to function logic 215. Readout circuitry 211 may be coupled to readout image data from the plurality of photodiodes in pixel array 205. In various examples, readout circuitry 211 may include amplification circuitry, analog-to-digital (ADC) conversion circuitry, or otherwise. Function logic 215 may simply store the image data or even manipulate the image data by applying post image effects (e.g. crop, rotate, remove red eye, adjust brightness, adjust contrast, or otherwise). In one example, readout circuitry 211 may readout a row of image data at a time along readout column lines (illustrated) or may readout the image data using a variety of other techniques (not illustrated), such as a serial readout or a full parallel readout of all pixels simultaneously.

In one example, control circuitry 221 is coupled to pixel array 205 to control operation of the plurality of photodiodes in pixel array 205. Control circuitry 221 may be configured to control operation of the pixel array 205. For example, control circuitry 221 may generate a shutter signal for controlling image acquisition. In one example, the shutter signal is a global shutter signal for simultaneously enabling all pixels within pixel array 205 to simultaneously capture their respective image data during a single acquisition window. In another example, the shutter signal is a rolling shutter signal such that each row, column, or group of pixels is sequentially enabled during consecutive acquisition windows. In another example, image acquisition is synchronized with lighting effects such as a flash.

In one example, imaging system 200 may be included in a digital camera, cell phone, laptop computer, or the like. Additionally, imaging system 200 may be coupled to other pieces of hardware such as a processor, memory elements, output (USB port, wireless transmitter, HDMI port, etc.), lighting/flash, electrical input (keyboard, touch display, track pad, mouse, microphone, etc.), and/or display. Other pieces of hardware may deliver instructions to imaging system 200, extract image data from imaging system 200, or manipulate image data supplied by imaging system 200.

Figure 3:
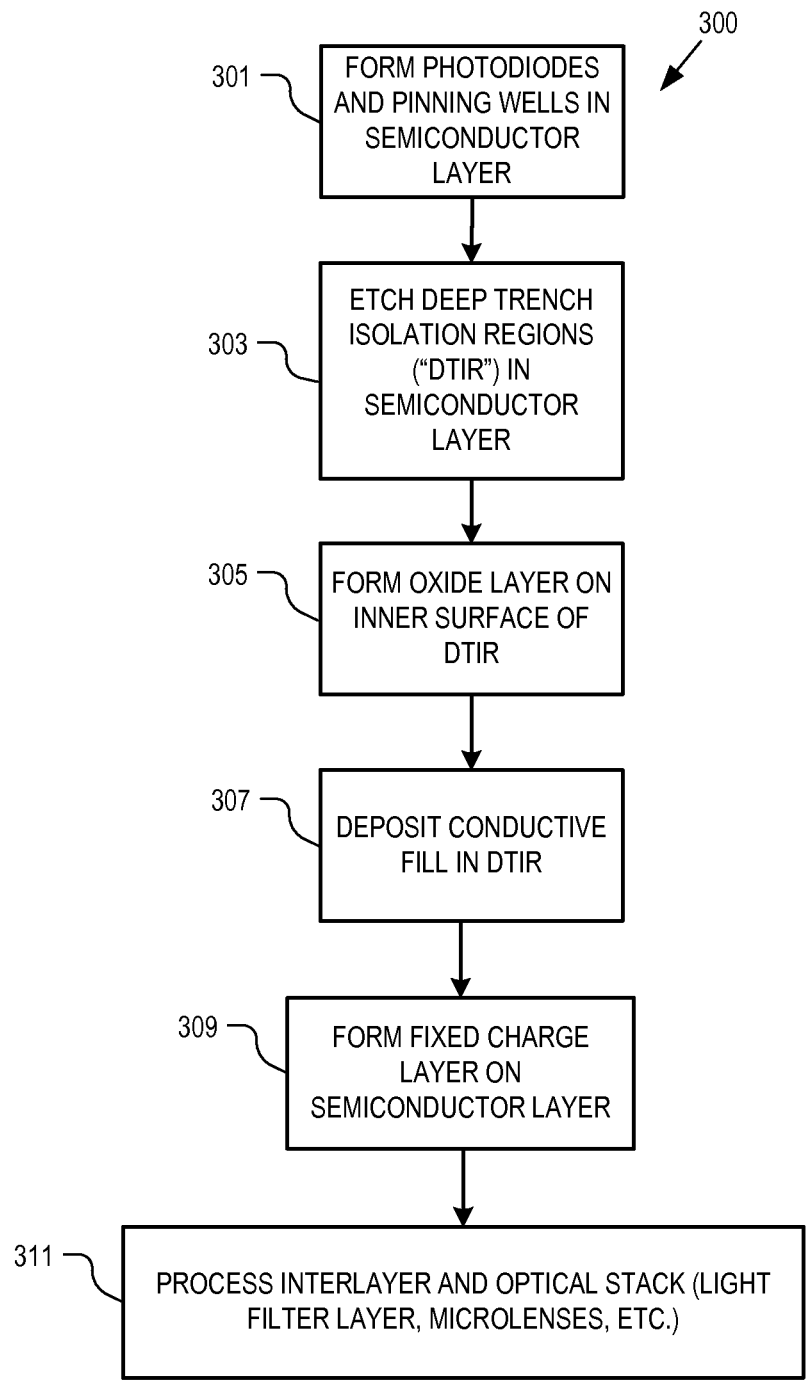
FIG. 3 is a flowchart of one example of a process for forming an image sensor, in accordance with the teachings of the present invention.

FIG. 3 is a flowchart of a process 300 for forming an image sensor, in accordance with the teachings of the present invention. The order in which some or all of the process blocks appear in process 300 should not be deemed limiting. Rather, one of ordinary skill in the art having the benefit of the present disclosure will understand that some of the process blocks may be executed in a variety of orders not illustrated, or even in parallel.

Process block 301 shows forming the plurality of photodiodes and the plurality of pinning wells (e.g. the plurality of pinning wells 103) in a semiconductor layer (e.g. semiconductor layer 101). In one example, the semiconductor layer is a silicon wafer or epitaxially grown silicon layer; however, in a different example, the semiconductor layer may include other well-known semiconductors such as Ge or GaAs. Photodiodes and pinning wells may be formed via ion implantation of dopant into the semiconductor layer. In one example, the photodiode includes p-type dopant such boron, or the like, and n-type dopant such as arsenic, phosphorus, or the like. Similarly, the pinning wells are doped and of the opposite majority charge carrier type as the photoactive region in the plurality of photodiodes (e.g. if the photoactive region in the photodiodes is n-type, then the pinning wells will be p-type).

Process block 301 illustrates etching deep trench isolation regions into the semiconductor layer. It should be noted that the deep trench isolation regions may form other shapes, not just the trapezoidal shape depicted in FIGS. 1A-1B, in accordance with the teachings of the present invention. One skilled in the art, having the benefit of the present disclosure, will recognize that depending on the image sensor being fabricated, different shape/aspect ratio deep trench isolation regions may be desired. In one example, the plurality of deep trench isolation regions may be triangular or rectangular. In another or the same example, the deep trench isolation regions may have a high aspect ratio; however, in a different example the deep trench isolation regions may have a low aspect ratio.

Etching of the deep trench isolation regions may be achieved via a wet etching process or a dry etching process. One skilled in the art will recognize that both types of etching have their own distinct advantages/disadvantages. Accordingly, depending on the desired etch speed, feature aspect ratio, and/or etch anisotropy, a wet or dry etch may be desired.

In process block 305, an oxide layer (e.g. oxide layer 105) is formed on the inner surface of the plurality of deep trench isolation regions. In one example, the oxide layer is formed by depositing and patterning an oxide. However, in a different example, the oxide layer is grown from the semiconductor layer.

Process block 307 details depositing a conductive fill (e.g. conductive fill 107) in the deep trench isolation regions. The conductive fill is deposited in the deep trench isolation regions such that the oxide layer is disposed between the semiconductor layer and the conductive fill. In one example, the conductive fill may include a metal and may be deposited via thermal evaporation. However, in a different example, the conductive fill may include a semiconductor. Although not depicted, in one example, excess conductive fill may be removed from the surface of the semiconductor layer via a chemical mechanical polish such that the conductive fill is flush with the top surface of the semiconductor layer. This polishing process allows for the uniform deposition of the fixed charge layer (e.g. fixed charge layer 109).

Process block 309, shows depositing the fixed charge layer (e.g. fixed charge layer 109) on the semiconductor layer. The fixed charge layer is disposed such that the plurality of deep trench isolation regions are between the plurality of pinning wells (e.g. the plurality of pinning wells 103) and the fixed charge layer. In one example the fixed charge layer may include, for example, silicon oxide ($SiO_2$), silicon nitride ($Si_3N_4$), silicon oxynitirde ($SiO_xN_y$), hafnium oxide ($HfO_2$), tantalum oxide ($Ta_2O_5$), titanium oxide ($TiO_2$), zirconium oxide ($ZrO_2$), aluminum oxide ($Al_2O_3$), lanthanum oxide ($La_2O_3$), praseodymium oxide ($Pr_2O_3$), cerium oxide ($CeO_2$), neodymium oxide ($Nd_2O_3$), promethium oxide ($Pm_2O_3$), samarium oxide ($Sm_2O_3$), europium oxide ($Eu_2O_3$), gadolinium oxide ($Gd_2O_3$), terbium oxide ($Tb_2O_3$), dysprosium oxide ($Dy_2O_3$), holmium oxide ($Ho_2O_3$), erbium oxide ($Er_2O_3$), thulium oxide ($Tm_2O_3$), ytterbium oxide ($Yb_2O_3$), lutetium oxide ($Lu_2O_3$), yttrium oxide ($Y_2O_3$), or the like. Additionally, one skilled in the relevant art, will recognize that any stoichiometric combination of the above metals/semiconductors and their oxides/nitrides/oxynitrides may be employed in a fixed charge layer, in accordance with the teachings of the present invention. In another or the same example, the fixed charge layer may include a thin metallic layer (such as Pt).

In process block 311 the interlayer (e.g. interlayer 121) and optical stack is formed. The interlayer is formed proximate to the fixed charge layer (e.g. fixed charge layer 109), such that the fixed charge layer is disposed between the interlayer and the semiconductor layer (e.g. semiconductor layer 101). In one example, the interlayer is made out of a polymer material such as a thermal or photo crosslinking resist. A light isolation barrier (e.g. light isolation barrier 123) may be disposed in the interlayer. The light isolation barrier may be constructed of a metal grid that prevents optical crosstalk between neighboring photodiodes. The light isolation barrier may also extend through the interlayer.

A light filter layer (e.g. light filter layer 139) is also formed on the interlayer. In one example, the light filter layer includes red, green, and blue light filters which may be arranged into a Bayer pattern, EXR pattern, X-trans pattern, or the like. However, in a different or the same example, the light filter layer may include infrared filters, ultraviolet filters, or other light filters that isolate invisible portions of the EM spectrum. A microlens layer (e.g. microlens layer 149) may be formed proximate to the light filter layer, such that the light filter layer is disposed between the fixed charge layer and the microlens layer.

FIGS. 4A-4E show a process for forming an image sensor, in accordance with the teachings of the present invention. The order in which some or all of the process occurs should not be deemed limiting. Rather, one of ordinary skill in the art having the benefit of the present disclosure will understand that some of the process may be executed in a variety of orders not illustrated, or even in parallel. Additionally, individual figures in FIGS. 4A-4E may correspond to process blocks in process 300.

FIG. 4A shows fabrication of the plurality of deep trench isolation regions in a semiconductor layer 401. Prior to forming the plurality of deep trench isolation regions, a plurality of photodiodes was formed in semiconductor layer 401 and a plurality of pinning wells 403 was also formed in semiconductor layer 401. As depicted, forming the plurality of deep trench isolation regions includes etching the plurality of deep trench isolation regions in semiconductor layer 401. Additionally, in the depicted example, each one of the plurality of pinning wells 403 contacts a corresponding one of the plurality of deep trench isolation regions, and the plurality of pinning wells 403 in combination with the plurality of deep trench isolation regions extends through semiconductor layer 401. The deep trench isolation regions align with the plurality of pinning wells 403 such that each one of the plurality of pinning wells 403 in combination with the corresponding one of the plurality of deep trench isolation regions is formed between individual photodiodes in the plurality of photodiodes.

FIG. 4B shows forming an oxide layer 405 on an inner surface of the plurality of deep trench isolation regions. In one example, oxide layer 405 includes silicon oxide. In another or the same example, oxide layer 405 may include a high-k metal oxide such as hafnium oxide, tantalum oxide, or the like. Oxide layer 405 may be fabricated by a deposition process or grown from semiconductor layer 401 itself.

FIG. 4C shows the deposition of a conductive fill 407 in the plurality of deep trench isolation regions. Conductive fill 407 is deposited such that oxide layer 405 is disposed between semiconductor layer 401 and conductive fill 407. In one example, conductive fill 407 includes a metal which is thermally evaporated onto semiconductor layer 401 and into the deep trench isolation regions. Although not depicted in FIG. 4C, after thermal evaporation, excess metal may be removed from semiconductor layer 401 via chemical-mechanical polishing. This chemical-mechanical polishing procedure results in the conductive fill 407 being flush with the top surface of semiconductor layer 401, in accordance with the teachings of the present invention.

Figure 4D:
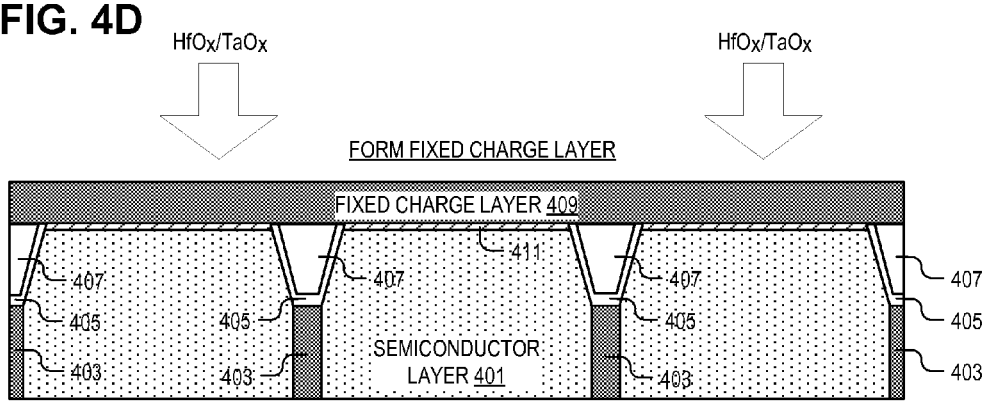

FIG. 4D shows forming a fixed charge layer 409 disposed on semiconductor layer 401, such that the plurality of deep trench isolation regions are disposed between the plurality of pinning wells 403 and fixed charge layer 409. Once formed, fixed charge layer 409 electrically couples to conductive fill 407. Conductive fill 407 and fixed charge layer 409 induce an opposite charge as fixed charge layer 409 in semiconductor layer 401 at an interface between the semiconductor layer 401 and a combination of the plurality of deep trench isolation regions and fixed charge layer 409. In other words, charge is induced in semiconductor layer 401 proximate to both the interface between semiconductor layer 401, and fixed charge layer 409, and the interface between semiconductor layer 401 and the plurality of deep trench isolation regions. Fixed charge layer 409 may include a metal oxide, metal nitride, metal oxynitride, semiconductor oxide, semiconductor nitride, or semiconductor oxynitride (for specific examples see discussion of FIG. 3). Additionally, fixed charge layer 409 may be deposited using atomic layer deposition, chemical vapor deposition, or molecular beam epitaxy. It should be noted, that a silicon oxide layer 411 may be formed on semiconductor layer 401. Silicon oxide layer 411 may be kept as one of the sub-layers included in fixed charge layer 409, or may be removed for processing of other charged materials.

Figure 4E:
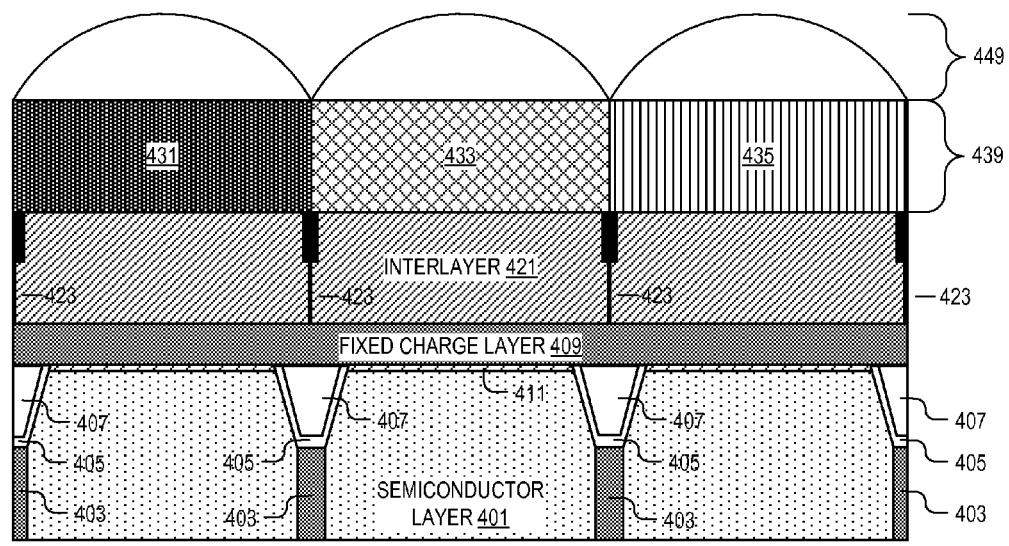

FIG. 4E shows the formation of an optical stack in addition to an interlayer 421. The optical stack may include a light filter layer 439, and a microlens layer 449. Interlayer 421 is formed proximate to fixed charge layer 409, such that fixed charge layer 409 is disposed between interlayer 421 and semiconductor layer 401. Interlayer 421 may be made out of a polymer material such as a thermal or photo crosslinking resist. A light isolation barrier 423 may be disposed in interlayer 421. Light isolation barrier 423 may be constructed of a metal grid that prevents optical crosstalk between neighboring photodiodes. Light isolation barrier 423 may also extend through interlayer 421.

In the depicted example, light filter layer 439 is formed on interlayer 421. In one example, light filter layer 439 includes red 431, green 433, and blue 435 light filters which may be arranged into a Bayer pattern, EXR pattern, X-trans pattern, or the like. However, in a different or the same example, light filter layer 439 may include infrared filters, ultraviolet filters, or other light filters that isolate invisible portions of the EM spectrum.

In the same or a different example, a microlens layer 449 is formed proximate to light filter layer 439, such that light filter layer 439 is disposed between fixed charge layer 409 and microlens layer 449. Microlens layer 449 may be fabricated from a photo-active polymer that is patterned on the surface of light filter layer 439. Once rectangular blocks of polymer are patterned on the surface of light filter layer 439, the blocks may be melted (or reflowed) to form the dome-like structure characteristic of microlenses.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. A method of image sensor fabrication, the method comprising:
   forming a plurality of photodiodes in a semiconductor layer;
   forming a plurality of pinning wells in the semiconductor layer;
   forming a plurality of deep trench isolation regions in the semiconductor layer, wherein forming the plurality of deep trench isolation regions includes:
   (1) forming an oxide layer on an inner surface of the plurality of deep trench isolation regions; and
   (2) depositing a conductive fill in the plurality of deep trench isolation regions, wherein the oxide layer is disposed between the semiconductor layer and the conductive fill; and
   forming a fixed charge layer disposed on the semiconductor layer wherein the plurality of deep trench isolation regions are disposed between the plurality of pinning wells and the fixed charge layer.

2. The method of claim 1, wherein the plurality of pinning wells in combination with the plurality of deep trench isolation regions are formed between individual photodiodes in the plurality of photodiodes.

3. The method of claim 1, wherein the plurality of pinning wells contact the plurality of deep trench isolation regions, and wherein the plurality of pinning wells in combination with the plurality of deep trench isolation regions extend through the semiconductor layer.

4. The method of claim 1, wherein forming the fixed charge layer electrically couples the fixed charge layer to the conductive fill, and wherein the conductive fill and the fixed charge layer induce an opposite charge as the fixed charge layer in the semiconductor layer at an interface between the semiconductor layer and a combination of the plurality of deep trench isolation regions and the fixed charge layer.

5. The method of claim 1, further comprising:
   forming an interlayer disposed proximate to the fixed charge layer, wherein the fixed charge layer is disposed between the interlayer and the semiconductor layer; and
   forming a light isolation barrier in the interlayer.

6. The method of claim 1, further comprising:
   forming a light filter layer disposed proximate to the fixed charge layer;
   forming a microlens layer disposed proximate to the light filter layer, wherein the light filter layer is disposed between the fixed charge layer and the microlens layer.

7. The method of claim 1, wherein forming the plurality of deep trench isolation regions includes etching the plurality of deep trench isolation regions in the semiconductor layer.

8. The method of claim 1, wherein the fixed charge layer includes at least one of metal oxide, metal nitride, metal oxynitride, semiconductor oxide, semiconductor nitride, or semiconductor oxynitride.

9. The method of claim 1, wherein the fixed charge layer is deposited using at least one of atomic layer deposition, chemical vapor deposition, or molecular beam epitaxy.

10. The method of claim 1, wherein after depositing the conductive fill, excess conductive fill is removed from a surface of the semiconductor layer via polishing.

\* \* \* \* \*